Figure 1:
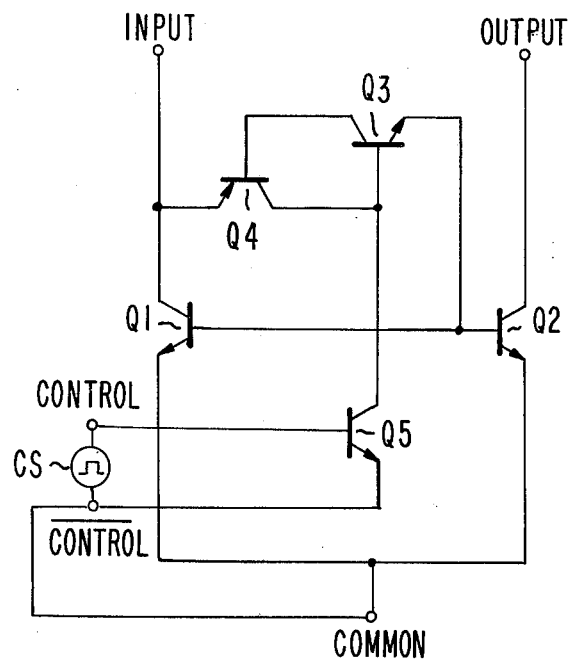

United States Patent [19]

Ahmed

[11] 4,117,417
[45] Sep. 26, 1978

[54] SWITCHABLE CURRENT AMPLIFIERS

[75] Inventor: Adel Abdel Aziz Ahmed, Annandale, N.J.

[73] Assignee: RCA Corporation, New York, N.Y.

[21] Appl. No.: 830,859

[22] Filed: Sep. 6, 1977

[51] Int. Cl.$^2$ .............................................. H03F 3/04
[52] U.S. Cl. .................................... 330/288; 307/255
[58] Field of Search ............... 330/278, 288; 307/296, 307/297, 255; 323/4

[56] References Cited

U.S. PATENT DOCUMENTS 3,973,215  8/1976  Ahmed ............................ 330/288 X

*Primary Examiner*—James B. Mullins
*Attorney, Agent, or Firm*—H. Christoffersen; Allen LeRoy Limberg; Richard G. Coalter

[57] ABSTRACT

In a current mirror amplifier having master and slave transistors, the master transistor is selectively provided with collector-to-base feedback to regulate its emitter-to-base potential and that of the slave transistor, the regulation of the emitter-to-base potentials conditioning the master transistor to accept input current applied to its collector-to-emitter path and conditioning the slave transistor to conduct a proportionally related output current. The selective collector-to-base feedback connection herein includes a regenerative latch circuit formed by connections between third and fourth transistors of respective conductivity tapes like and opposite to that of the master transistor. The third and fourth transistors have their emitter electrodes connected to the base and collector, respectively, of the master transistor and each has its collector electrode connected to the base electrode of each other to form the regenerative latch circuit. Conduction through this latch circuit is interrupted by diverting the collector current of the fourth transistor from the base electrode of the third transistor, whereupon the current mirror amplifier no longer accepts input current or supplies an output current.

7 Claims, 3 Drawing Figures

SWITCHABLE CURRENT AMPLIFIERS

The present invention relates to switchable current amplifiers.

A current mirror amplifier (CMA) is a current amplifier exhibiting a current gain of −G between an input terminal and an output terminal, 1:G being the ratio between the respective collector-current-versus-emitter-to-base voltage characteristics of a master transistor connected to conduct input current and of a slave transistor connected to conduct output current. The master transistor is provided with a collector-to-base feedback connection to apply an emitter-to-base potential thereto as will condition the transistor to conduct, through its emitter-to-collector path, substantially the entire input current applied to the current mirror amplifier. The slave transistor conducts output current through its emitter-to-collector path responsive to the application of an emitter-to-base potential equal to that of the master transistor.

The present invention is embodied in a CMA that can be selectively enabled or disabled in operation. Third and fourth transistors of respective conductivity types like and complementary to that of the master transistor have their respective collectors connected to the bases of each other, to form a regenerative latch circuit. This latch circuit is included in the collector-to-base feedback connection of the master transistor, the collector of the master transistor being connected to the emitter of the fourth transistor and the emitter electrode of the third transistor being connected to the base electrode of the master transistor. To disable the operation of the CMA, means are provided for diverting the collector current of the fourth transistor from flowing to the base of the third transistor, interrupting the collector-to-base feedback connection of the master transistor.

Figure 2:
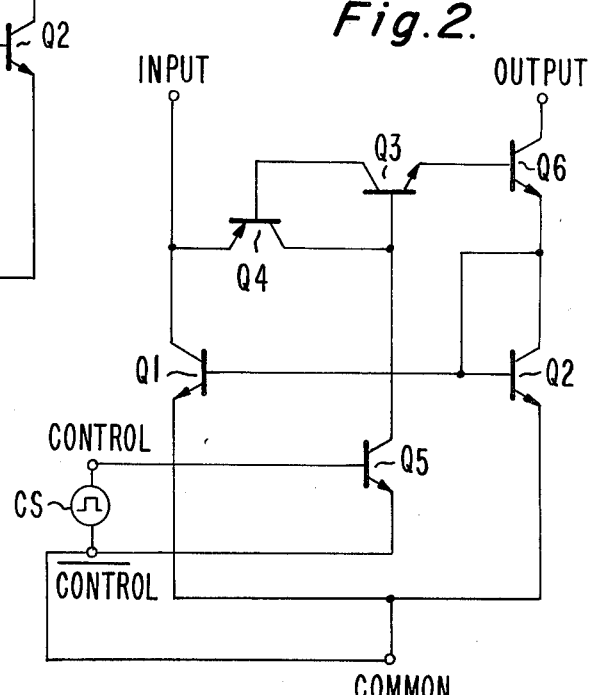
Figure 3:
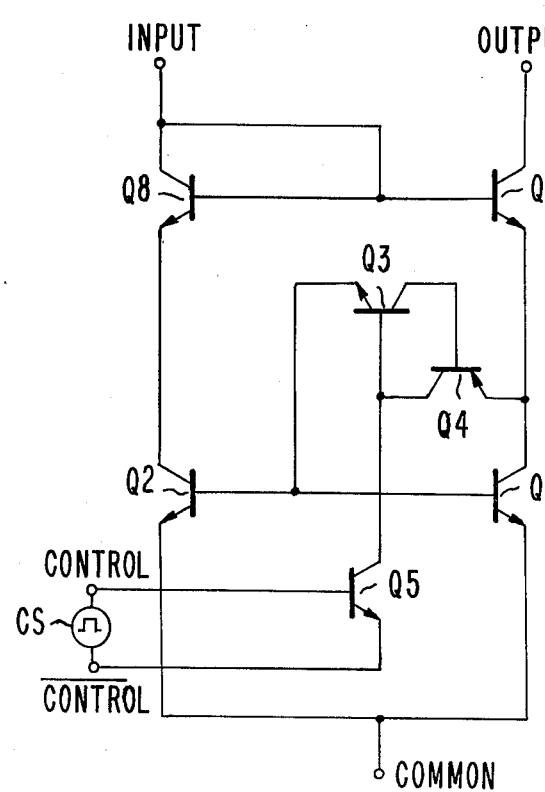

In the drawing, FIGS. 1, 2 and 3 are schematic diagrams of switched current mirror amplifiers, each embodying the present invention.

In the FIG. 1 switched current mirror amplifier, Q1 and Q2 are the master and slave transistors, respectively. The collector electrodes of Q1 and Q2 are connected to the input terminal IN and to the output terminal OUT, respectively, of the CMA. Their emitter electrodes have respective connections to the common terminal, COMMON, each connection being shown as a direct connection without intervening impedances. These connections may, however, be via emitter degeneration resistors, as well-known in the art. The collector-to-base connection of Q1 departs from the prior art in comprising transistors Q3 and Q4 of complementary conductivity types in regenerative latch connection.

More particularly, absent conduction of transistor Q5, the collector current of Q4 is applied to the base of Q3, and the collector current of Q3 is applied to the base of Q4 to form a regenerative feedback loop tending to have a gain equal to the product of the normal common-emitter forward current gains (or $h_{fe}$'s) of Q3 and Q4. This product is much in excess of unity, so beginning from an initial state of non-conduction by Q3 and Q4, inherent noise disturbances in the loop build up to bias both Q3 and Q4 towards increasing conduction. The transistors Q3 and Q4 saturate as their conduction increases, reducing loop gain to unity and providing a low impedance path between their respective emitter electrodes. This low-impedance path provides collector-to-base feedback to the master transistor Q1, and CMA operation analogous to that of prior art circuits obtains.

CMA operation is disabled by diverting the collector current of transistor Q4 from being applied to the base electrode of Q3. In the particular embodiment of the invention shown, the means for diverting the collector current of Q4 from the base of Q3 comprises transistor Q5, connected at its collector to the base of Q3, and a control signal source CS, connected between control terminals CONTROL and $\overline{\text{CONTROL}}$ at the base and emitter electrodes respectively of Q5. The $\overline{\text{CONTROL}}$ terminal is referred in potential to the CMA common terminal COMMON for example, by direct connection without intervening impedance between the terminals $\overline{\text{CONTROL}}$ and COMMON, as shown. Control signal is selectively provided from source CS to forward-bias the base-emitter junction of Q5. Consequently, Q5 clamps the base of Q3 to a potential close to that at the terminal COMMON so there is no possibility of forward conduction across the base-emitter junctions of Q3, Q1 and Q2. There is no base current flow to Q3, so it supplies no emitter current to be divided between Q1 and Q2 as base currents. Q1 then will not conduct applied input current, nor will Q2 conduct an output current.

Various modifications to this basic switched CMA will, in light of this disclosure, suggest themselves to one skilled in the art of circuit design, and the scope of the following claims should be accordingly construed to include such modifications as use the spirit and teaching of the invention herein disclosed. For example, one may wish to connect the input terminal IN to the emitter electrode of Q4 by means of an emitter- or source-follower transistor to reduce departure of current gain from the theoretical ideal owing to transistor base currents. The CMA may be provided with another output terminal at the collector electrode of a further transistor with its base-emitter junction parallelling that of Q2. One may provide Q1 and Q2 with respective emitter degeneration resistors, or the CMA may be modified so only one of Q1 and Q2 is provided with an emitter degeneration resistance.

In the FIG. 2 switched CMA, one may view Q1 and Q2 as the master and slave transistors, the collector of Q1 being connected to the input terminal IN, and the emitters of Q1 and Q2 being connected either directly, as shown, or by suitable resistances to common terminal COMMON. Q3 and Q4 provide selective direct coupling, dependent upon the non-conduction or conduction of Q5 responsive to control signal from source CS, of the input terminal IN to the base electrodes of Q1 and Q2. This selective coupling is provided, however, through the intermediation of the emitter-follower action of transistor Q6. Further, the collector of Q2 is not directly connected to output terminal OUT, but is coupled thereto via the common-base amplifier action of Q6.

The FIG. 3 switched CMA comprises a transistor Q7 selectively provided direct-coupled emitter-to-base feedback by a component swiched CMA like that shown in FIG. 1. This feedback stabilizes the base-to-collector current gain of Q7, causing it to be substantially equal to the reciprocal of the current gain of the component swiched CMA. When Q5 is conductive to disable the component swiched CMA, both Q1 and Q4 are substantially non-conductive, providing Q7 with a high degree of emitter degeneration. This reduces the current gain of the FIG. 3 switched CMA, so there is substantially no response at its output terminal OUT to current applied to its input terminal IN. Transistor Q8 is self-biased by direct connection between its collector and base electrodes, so it functions as a diode. This provides offsetting compensation for the base-to-emitter offset potential of Q7, to place equal collector potentials on Q1 and Q2, which improves the tracking between their respective collector current versus emitter-to-base voltage characteristics.

What is claimed is:

1. A switchable current amplifier comprising:
   input, output and common terminals;
   first, second and third transistors of a first conductivity type and a fourth transistor of a second conductivity type complementary to said first conductivity type, each having respective base and emitter and collector electrodes;
   connections of the collector electrodes of said first and said second transistors respectively to said input terminal and to said output terminal;
   connections of the emitter electrodes of said first and said second transistors to said common terminal;
   means connecting said third and said fourth transistors as a latch circuit between said input terminal and an interconnection between the base electrodes of said first and said second transistors, which latch circuit when latched completes the connection of said first and said second transistors in a current mirror amplifier configuration, said means including:
   a connection of the emitter electrode of said third transistor to said interconnection between the base electrodes of said first and said second transistors, a connection of the collector electrode of said third transistor to the base electrode of said fourth transistor, a connection of the collector electrode of said fourth transistor to the base electrode of said third transistor, and a connection of said input terminal to the emitter electrode of said fourth transistor; and
   disabling means for selectively diverting collector current of said fourth transistor from being applied to the base electrode of said third transistor.

2. A switchable current amplifier as set forth in claim 1 including a further transistor of said first conductivity type, said further transistor having base and emitter and collector electrodes and having base-to-emitter and emitter-to-collector circuits, the base electrode of said further transistor having the emitter electrode of said third transistor connected thereto, the emitter electrode of said further transistor being connected to the interconnection of the base electrodes of said first and second transistors and having the collector electrode of said second transistor connected thereto, and the collector electrode of said further transistor being connected to said output terminal, whereby the base-to-emitter circuit of said further transistor provides for said connection of the emitter electrode of said third transistor to said interconnection between the base electrodes of said first and said second transistors, and whereby the emitter-to-collector circuit of said further transistor provides for said connection of the collector electrode of said second transistor to said output terminal.

3. A switchable current amplifier as set forth in claim 1 in combination with a further transistor having base and emitter and collector electrodes, said switched current amplifier being connected to provide selectively direct-coupled emitter-to-base feedback to said further transistor.

4. A switchable current amplifier as set forth in claim 1 wherein said disabling means includes:
   a fifth transistor of said first conductivity having base and emitter electrodes and having a collector electrode connected to the connection of the collector electrode of said fourth transistor to the base electrode of said third transistor, and
   means for selectively applying a forward biasing potential between the emitter and base electrodes of said fifth transistor to condition it for selectively diverting to itself as its collector current the collector current of said fourth transistor and thereby depriving said third transistor of base current.

5. A switchable current amplifier comprising:
   input, output and common terminals;
   first and second and third transistors of a first conductivity type and a fourth transistor of a second conductivity type complementary to said first conductivity type, each having respective base and emitter and collector electrodes;
   connections of the collector electrodes of said first and said second transistors respectively to said input terminal and to said output terminal;
   connections of the emitter electrodes of said first and said second transistors to said common terminal;
   means connecting said third and said fourth transistors as a latch circuit between said input terminal and an interconnection between the base electrodes of said first and said second transistors, which latch circuit when latched completes the connection of said first and said second transistors in a current mirror amplifier configuration, including a connection of the emitter electrode of said third transistor connected to said interconnection between the base electrodes of said first and said second transistors, including a connection of the collector electrode of said third transistor to the base electrode of said fourth transistor, including a connection of the collector electrode of said fourth transistor to the base electrode of said third transistor, and including a connection of said input terminal to the emitter electrode of said fourth transistor; and
   disabling means for selectively clamping the base electrode of said third transistor to said common terminal.

6. A switchable current amplifier as set forth in claim 5 including a further transistor of said first conductivity type, said further transistor having base and emitter and collector electrodes and having base-to-emitter and emitter-to-collector circuits, the base electrode of said further transistor having the emitter electrode of said third transistor connected thereto, the emitter electrode of said further transistor being connected to the interconnection of the base electrodes of said first and second transistors and having the collector electrode of said second transistor connected thereto, and the collector electrode of said further transistor being connected to said output terminal, whereby the base-to-emitter circuit of said further transistor provides for said connection of the emitter electrode of said third transistor to said interconnection between the base electrodes of said first and said second transistors, and whereby the emitter-to-collector circuit of said further transistor provides for said connection of the collector electrode of said second transistor to said output terminal.

7. A switchable current amplifier as set forth in claim 5 in combination with a further transistor having base and emitter and collector electrodes, said switched current mirror amplifier being connected to provide selectively direct-coupled emitter-to-base feedback to said further transistor.

* * * * *